(12) United States Patent
Wright et al.

(10) Patent No.: US 7,714,564 B2
(45) Date of Patent: May 11, 2010

(54) GATED SWEEP IN SPECTRUM ANALYZERS

(75) Inventors: Thomas M Wright, Santa Rosa, CA (US); Wing J Mar, Rohnert Park, CA (US); Joseph M Gorin, Santa Rosa, CA (US); Gregory B Korelich, Santa Rosa, CA (US); Douglas Gordon Yule, Jr., Sebastopol, CA (US)

(73) Assignee: Agilent Technologies, Inc., Santa Clara, CA (US)

( * ) Notice: Subject to any disclaimer, the term of this patent is extended or adjusted under 35 U.S.C. 154(b) by 280 days.

(21) Appl. No.: 12/015,251

(22) Filed: Jan. 16, 2008

(65) Prior Publication Data

US 2009/0179630 A1 Jul. 16, 2009

(51) Int. Cl.
*G01R 23/16* (2006.01)
(52) U.S. Cl. ............... 324/76.23; 324/76.19; 455/226.1
(58) Field of Classification Search ............... 324/76.23, 324/76.19; 455/226.1

See application file for complete search history.

(56) References Cited

U.S. PATENT DOCUMENTS

| 5,210,483 | A * | 5/1993 | Amamoto et al. | 324/76.27 |
|---|---|---|---|---|
| 5,534,996 | A * | 7/1996 | Mori et al. | 356/218 |
| 5,869,959 | A * | 2/1999 | Tomikawa | 324/76.27 |
| 6,140,809 | A * | 10/2000 | Doi | 324/76.24 |
| 6,445,327 | B1 * | 9/2002 | Kishi | 341/155 |
| 2006/0286953 | A1* | 12/2006 | Takaoku | 455/226.1 |
| 2008/0309388 | A1* | 12/2008 | Hashimoto et al. | 327/161 |
| 2009/0045798 | A1* | 2/2009 | Heah et al. | 324/76.19 |

* cited by examiner

*Primary Examiner*—Timothy J Dole
*Assistant Examiner*—John Zhu

(57) ABSTRACT

A measurement technique that provides a full solution to the gated local oscillator sweep measurement and improves the accuracy of signal analyzers in gated sweep mode by pre-sweeping the local oscillator at the beginning of a gate pulse and over-sweeping the local oscillator at the end of each gate pulse.

3 Claims, 5 Drawing Sheets

GATED SWEEP IN SPECTRUM ANALYZERS

BACKGROUND

Making accurate spectrum and power measurements on the desired portion of time-varying and complex modulated signals is a common measurement challenge. These measurements are made with a spectrum analyzer using one of several types of time-selective spectrum analysis, e.g. swept analysis or "gated local oscillator (LO)" or simply "gated sweep". The sweeping local oscillator of the analyzer is directed to sweep and measure only during the desired portion of the signal. The goal is a measurement that has the same amplitude and frequency accuracy and resolution as a non-gated measurement, and which can be made quickly and simply. The task is complicated by the need for accurate triggering and gate timing, along with potential errors created by the interaction of the changing signal and the dynamic characteristics of the analyzer's LO and Intermediate Frequency (IF) filters. Three different techniques are generally used for time-selective spectrum and power measurements: Gated LO, Gated Video, and Gated Fast Fourier Transform (FFT).

For Gated LO measurements, the spectrum analyzer's local oscillator is controlled so that it is sweeping (and spectrum is measured) only during the desired portion of the input signal. Otherwise the measurement is halted or paused when the signal is outside of the gate interval, with sweeping resuming at the beginning of the next gate interval. Multiple sweep segments are required to generate a complete spectrum, with the number of segments required depending primarily on the analyzer's sweep time and the duration of the gate.

For swept spectrum analyzers, the gated LO technique is generally the best one to choose, if available on the analyzer you're using. Gated LO provides good flexibility in frequency span and gate timing, and measurements are completed faster than with gated video. Gated LO measurements are also easier to set up than gated video, as there is no need to carefully choose a sweep time. The transient responses within the analyzer are problematic. The transient response of the RBW and VBW (IF) filters reduces the available measuring time for each gate event and thus increases the number of segments required and thus the measurement time. The transient response of the LO adds measurement delay since the LO cannot be instantaneously started or stopped.

In implementing gated LO solutions in swept analyzers, the general practice has been to provide appropriate supplemental specifications for gated measurements, along with operational cautions and exceptions. Whether time-gated measurements are specified or not, in some cases spectrum analyzer users are unaware of the potential accuracy and repeatability problems of time-gated measurements.

The most straightforward way to account for the settling time required by the IF filters and preselectors is to add a delay (from when the gate opens and/or the signal is valid) to the measurement process. To improve measurement speed and allow for the shortest gate times, this delay should be minimized. Two sources of error remain. First, data acquired at the end of a sweep segment when the LO is settling to a stop: The frequency of some measured data will be distorted by the frequency settling of the LO as it is stopped at the end of the gate. Second, sweep linearity errors (frequency and span errors) accumulate due to small LO frequency errors in each sweep segment: The usual practice of sweeping for precisely the duration of the gate does not allow for any correction of imperfect frequency start/stop values associated with non-ideal behavior of the LO at the beginning and end of gate segments.

For a first order solution the starting and stopping of the analyzer's LO must be accurately controlled, and the sweeping must remain as linear as possible despite the start/stop operations. Since the spectrum result is assembled from multiple sweep segments, each one must accurately match those before and after it, and timing/frequency errors must not be allowed to stack up, especially in situations where a spectrum measurement is made from a large number of segments.

For Gated Video measurements, the analyzer sweeps continuously with the gate signal used to select which measurement points are retained and displayed. The analyzer's sweep time must be set so that the gate signal is valid during at least some portion of the duration of each display point, or gaps in the measured spectrum will result. Thus gate time must be carefully chosen, and hundreds of gate events may be required for a complete spectrum measurement, frequently resulting in slow total measurement times.

For Gated FFT measurements, the signal in the analyzer's IF is digitally sampled and a time record is constructed from the samples that are within the gate window. A Fourier transform is performed on the time record, yielding a spectrum measurement of the signal from the valid gate interval only. No sweeping local oscillator is involved, and in many cases the spectrum can be measured from a single gate interval. The gated FFT mode does not provide adjustable resolution bandwidth, and measurements requiring concatenated FFTs will be much slower than those that do not.

Understanding the effective accuracy of a particular gated measurement is difficult because of the interaction of the signal and the analyzer's gated measurement hardware and firmware. For example, two different measurements using the same analyzer setup (gate timing, span, etc.) might have different errors due to differing spectral content or power level of the signal under test.

DETAILED DESCRIPTION

Figure 1:
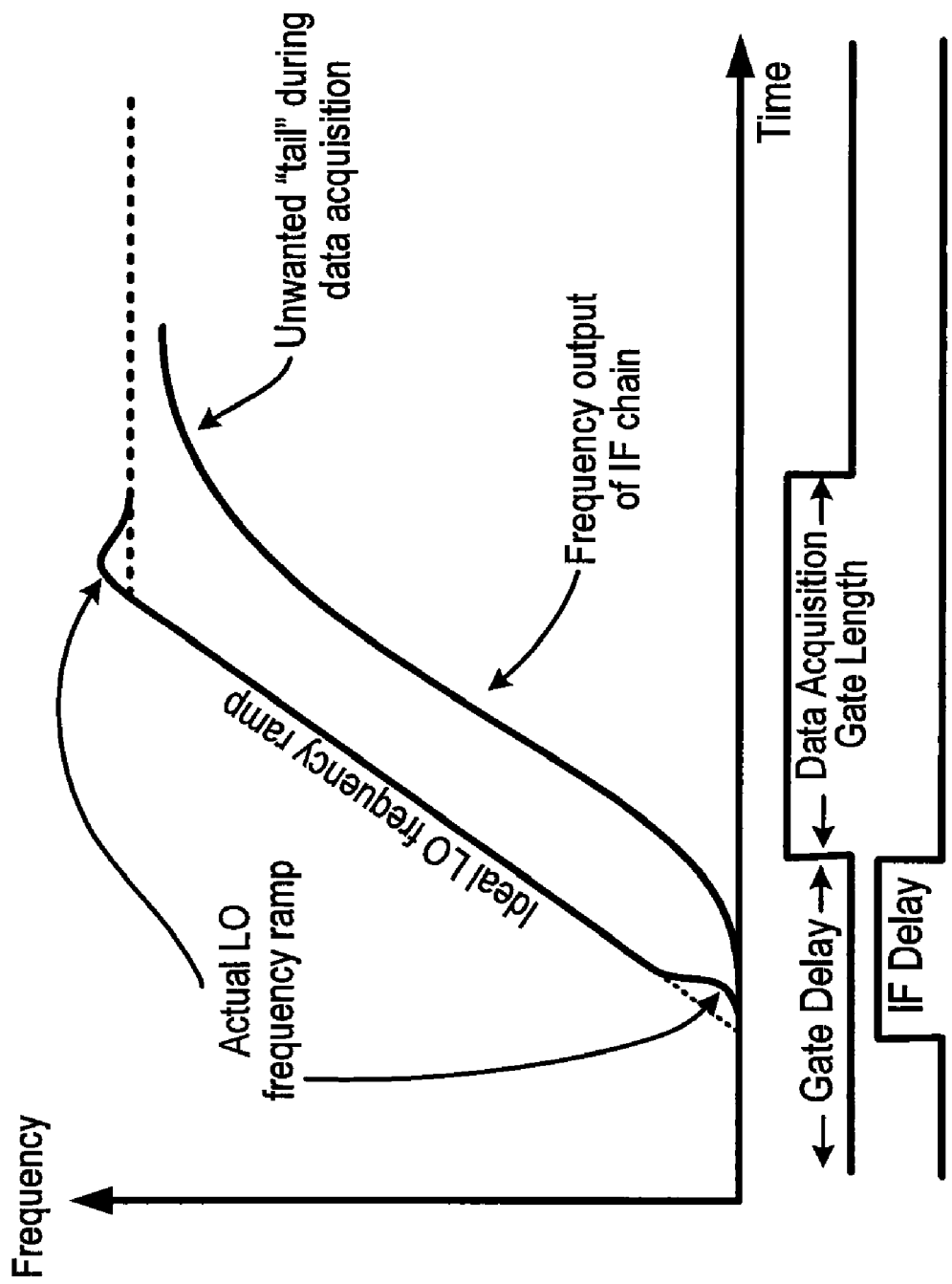
FIG. 1 illustrates a gated sweep measurement of the prior art.
Figure 2:
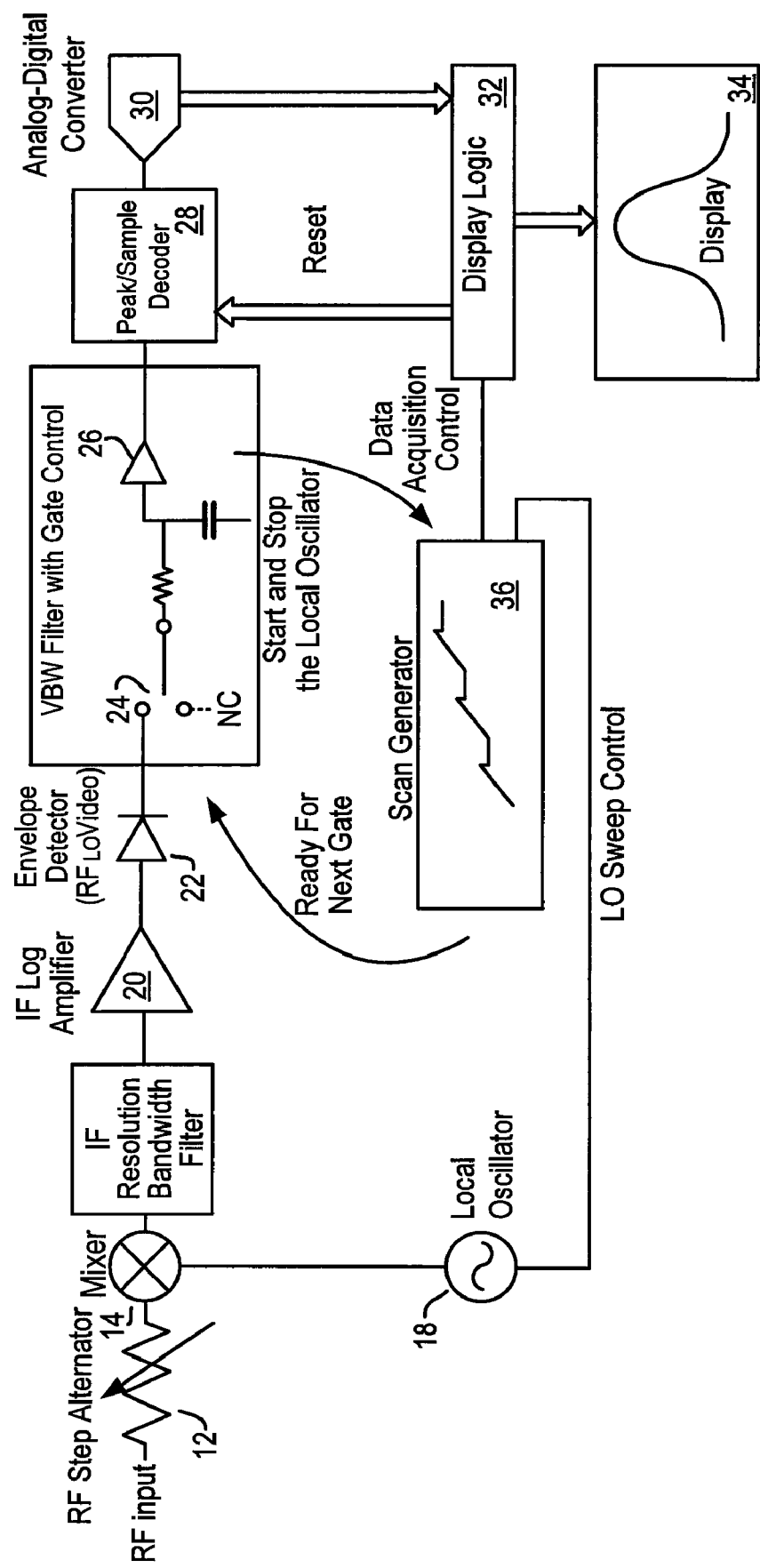
FIG. 2 illustrates a functional block diagram according to the invention.

FIG. 2 illustrates a functional block diagram 10 according to the invention. A RF step attenuator 12 receives a RF signal. A mixer 14 receives inputs from a local oscillator (LO) 16 and the RF step attenuator. An IF Resolution Bandwidth Filter 1 interposes the mixer output and an input of an IF Log Amplifier 20. An Envelope Detector 22 interposes the output of the IF Log Amplifier 20 and an input of a gate controller 24. A Video Bandwidth Filter 26 receives the output of the gate controller 24. A Peak Sample Detector 28 interposes the Video Bandwidth Filter 26 and an A/D Converter 30. Display logic 32 receives the output of the A/D Converter 30 and provides a Reset signal to the Peak Sample Detector 28. The Display Logic 32 is further connected to a Display 34. A Scan Generator 36 interposes the output of the Display Logic and input of the LO. The Scan Generator 36 is bidirectionally connected to the gate controller 24.

The Gate Controller 24 may be implemented as a Field Programmable Gate Array (FPGA).

Figure 3:
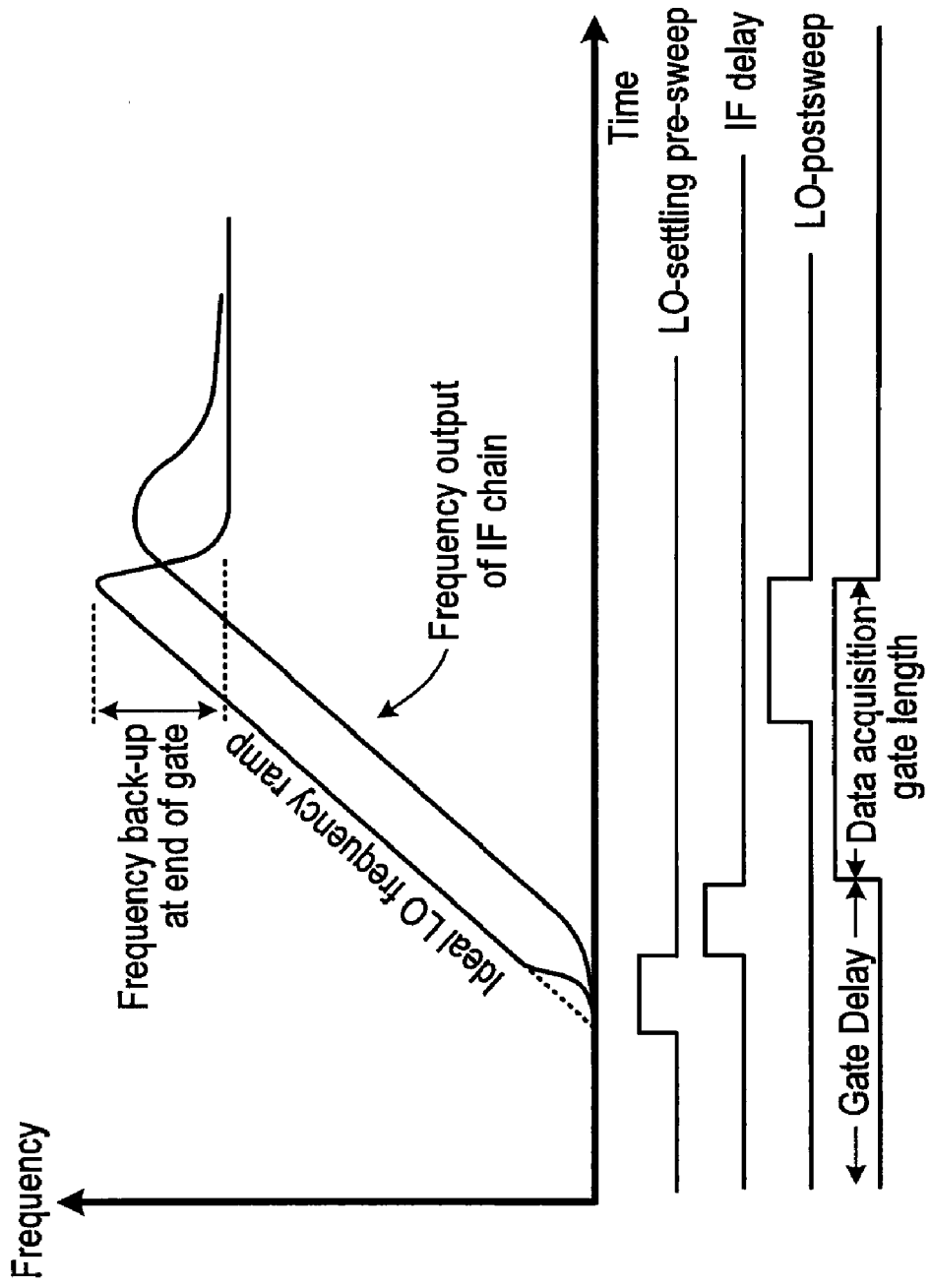
FIG. 3 illustrates a timing diagram according to FIG. 2.

In operation, the innovation is an LO with intelligent new "pre-sweep" and "post-sweep" functions, and the ability to perform a precise "back-up" operation to return a post-swept LO to the correct frequency for the start of the next gate. The pre-sweeping of the LO occurs during the gate delay, allowing both the LO and the IF filter settling transients to stabilize before measurement data is taken. The intelligent LO sweep operations are shown in the form of a timing diagram in FIG. 3.

Figure 4:
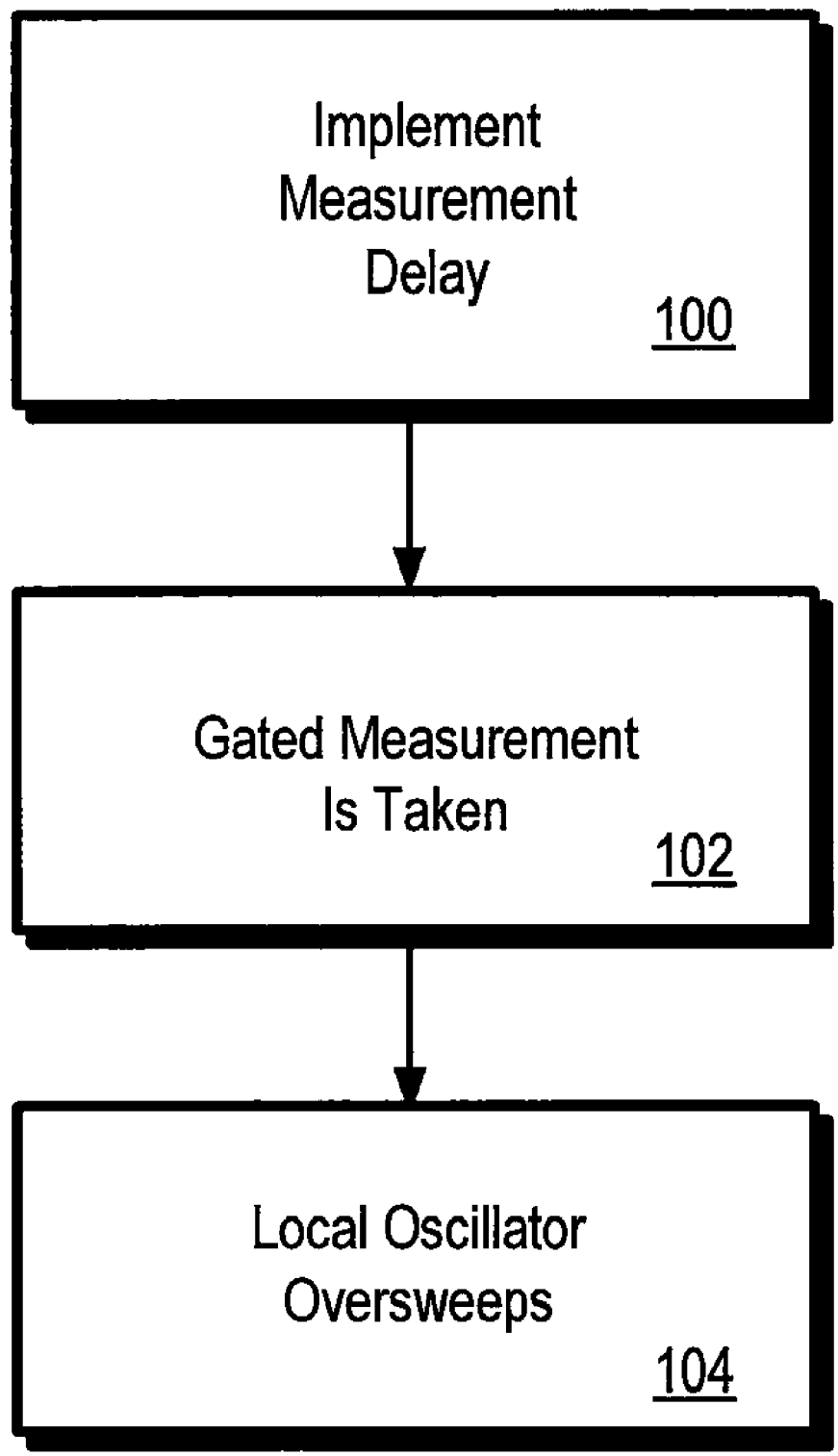
FIG. 4 is process flowchart according to the invention.

FIG. 4 illustrates a process flowchart according to the invention. In step 100, at the beginning of the gated sweep measurement, a measurement delay is implemented to allow LO and IF transients to die out, shown here by the LO pre-sweep signal. In step 102, the gated sweep measurement is taken. In step 104, at the end of the gate, the LO continues to sweep (post-sweep) or oversweep for a short time so that its sweeping is entirely linear for the full duration of the sweep segment. This allows for positioning at the correct start frequency for the next gate. The LO back-ups by the sum of the pre-sweep and the post-sweep frequency. The oversweep is set to the delay of the IF. The delay of the IF has two parts, that of the Resolution Bandwidth (RBW) and that due to the Video Bandwidth. The total delay in absolute time units is approximately $$IFDelay = \frac{2.5612}{RBW} + \frac{1}{2*\pi*VBW} \qquad \text{Equation 1}$$

A key feature of this invention follows the post-sweeping of the LO: A calibrated "back-up" or partial re-trace of the LO frequency sweep. The back-up of the LO is essential to allow for the post-sweeping of the LO and to reset the LO frequency accurately for the beginning of the next sweep segment. In practice, the LO backs up by the sum (in frequency) of the pre-sweep and the post-sweep. The result of this advanced LO control capability is improvements in both the accuracy and consistency of gated spectrum measurements.

Figure 5:
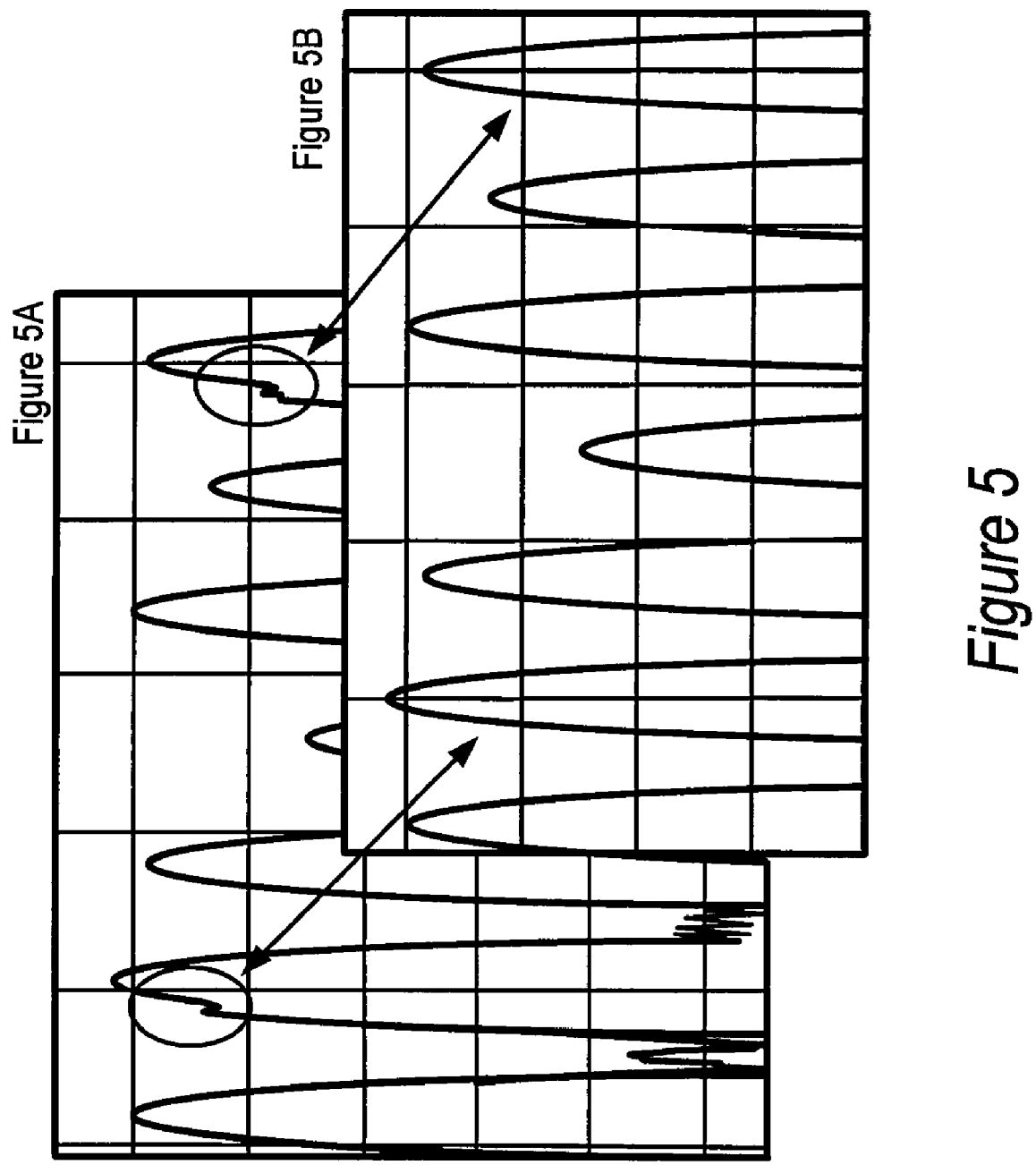
FIG. 5 is comparison of time-gated measurements both with and without this technology is shown in FIG. 2.

A comparison of time-gated measurements both with and without this technology is shown in FIGS. 5A and 5B. FIG. 5A is the gated sweep measurement without this technology while FIG. 5B is the gated sweep measurement with this technology. Note that full correction of the LO and IF transient effects changes both the measured frequency of the signal and the shape of its spectrum.

We claim:

1. A signal analyzer comprising:
   a RF step attenuator, receiving a RF signal, generating an attenuator signal;
   a mixer, receiving the attenuator signal and a LO signal, generating a mixer signal;
   an IF Resolution Bandwidth Filter, receiving the mixer signal, generating an IF signal;
   an IF Log Amplifier, receiving the IF signal, generating an amplifier signal;
   an Envelope Detector, receiving the amplifier signal, generating an envelope signal;
   a gate controller, receiving the envelope signal and a Ready signal, generating a GC output signal and a GC control signal;
   a Video Bandwidth Filter, receiving the GC output signal, generating a video signal;
   a Peak Sample Detector receiving the video signal, generating a peak signal;
   an A/D Converter receiving the peak signal, generating an A/D signal;
   Display logic receiving the A/D signal, generating a Reset signal and a Display signal;
   a display receiving the display signal;
   a scan generator, bidirectionally connected to the gate controller, receiving the GC control signal and outputting the Ready signal, having an scan signal; and
   a local oscillator, receiving the scan signal, generating the LO signal.

2. An apparatus, as in claim 1, wherein the gate controller is implemented as a FPGA.

3. A method comprising:
   for the signal analyzer of claim 1 having a gated sweep mode,
   applying a measurement delay to allow local oscillator transients to decay;
   applying a gated sweep measurement; and
   oversweeping for a predetermined duration.

* * * * *